(12) United States Patent
Snider (10) Patent No.: US 8,780,601 B2
(45) Date of Patent: Jul. 15, 2014

(54) THREE-DIMENSIONAL INTEGRATED CIRCUIT

(75) Inventor: Gregory Stuart Snider, Los Altos, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 79 days.

(21) Appl. No.: 13/700,224

(22) PCT Filed: Jun. 8, 2010

(86) PCT No.: PCT/US2010/037830
§ 371 (c)(1),
(2), (4) Date: Nov. 27, 2012

(87) PCT Pub. No.: WO2011/155928
PCT Pub. Date: Dec. 15, 2011

(65) Prior Publication Data
US 2013/0121054 A1 May 16, 2013

(51) Int. Cl.
*G11C 5/06* (2006.01)
*G11C 13/00* (2006.01)

(52) U.S. Cl.
CPC .............. *G11C 13/0002* (2013.01); *G11C 5/06* (2013.01); *Y10S 977/943* (2013.01)
USPC ........ 365/63; 365/130; 365/148; 365/189.05; 365/189.11; 977/943

(58) Field of Classification Search
CPC ....... G11C 5/06; G11C 5/063; G11C 13/0002
USPC .................. 365/63, 130, 148, 189.05, 189.11, 365/230.06; 977/762, 943
See application file for complete search history.

(56) References Cited

U.S. PATENT DOCUMENTS

| 7,570,511 | B2 | 8/2009 | Cho et al. | |
|---|---|---|---|---|
| 7,692,952 | B2 * | 4/2010 | DeHon | ......................... 365/151 |
| 7,910,914 | B2 | 3/2011 | Tanaka et al. | |
| 8,687,402 | B2 * | 4/2014 | Lu et al. | ....................... 365/148 |
| 2006/0238223 | A1 | 10/2006 | Kuekes et al. | |

FOREIGN PATENT DOCUMENTS

| JP | 2008181978 | 8/2008 |
|---|---|---|
| KR | 100827697 | 5/2008 |
| WO | WO-2009075694 | 6/2009 |

OTHER PUBLICATIONS

PCT International Search Report, PCT/US2010/037830, Apr. 14, 2011.

\* cited by examiner

*Primary Examiner* — Tan T. Nguyen (57) ABSTRACT

A three-dimensional integrated circuit comprising a submicroscale integrated-circuit substrate and n nanoscale layers stacked above the submicroscale integrated-circuit substrate, a nanowire-junction memory element in each of which is independently controlled by two submicroscale subcomponents within the submicroscale integrated-circuit substrate, the first submicroscale subcomponent coupled through a first set of switches to each of the n nanowire-junction memory elements and the second submicroscale subcomponent coupled through a second set of switches to each of the n nanowire-junction memory elements, the total number of switches in the first and second sets of switches less than 2n, and n greater than or equal to 2.

14 Claims, 10 Drawing Sheets

THREE-DIMENSIONAL INTEGRATED CIRCUIT

STATEMENT OF GOVERNMENT INTEREST

This invention has been made with Government support under Contract No. HR0011-09-3-0001, awarded by the Defense Advanced Research Projects Agency. The government has certain rights in the invention.

TECHNICAL FIELD

The present invention is related to three-dimensional electronic circuitry and, in particular, to three-dimensional integrated circuits comprising multiple nanowire-crossbar memories layered above a traditional microscale or submicroscale integrated circuit.

BACKGROUND

Integrated circuits and integrated-circuit technologies, including the complementary-metal-oxide-semiconductor integrated-circuit-fabrication technology ("CMOS"), represent the backbone of modern electronics. Integrated-circuit microprocessors are the computing engines for modern computer systems, which use integrated-circuit electronic memories for storing data processed and produced by microprocessors. Special-purpose integrated circuits are employed as controllers in a wide variety of consumer products, from appliances and automobiles to cell phones, cameras, and children's toys.

Relentless increases in the densities of circuitry and decreases in the sizes of signal lines and other circuit elements fabricated within integrated circuits are largely driven by the need to produce ever faster and more capable microprocessors for computer systems. In general, improvements in microprocessor integrated circuits and technologies for designing and manufacturing microprocessor integrated circuits are quickly assimilated into the design and manufacture of the various types of integrated circuits used in all of the other types of devices and systems that employ integrated circuits, providing a large market eager for each new generation of integrated-circuit technology.

The photolithography-based methods currently employed to manufacture integrated circuits are associated with certain physical constraints that may limit the degree to which traditional integrated-circuit technology can continue to be improved. As the dimensions of signal lines, transistors, and other electronic components of submicroscale circuitry further decrease, the reliability with which such components can be manufactured and with conventional photolithography-based methods is also decreasing, resulting in decreasing yields of functional integrated circuits during manufacturing and problems associated with the operational characteristics of integrated circuits. Below certain dimensions, the behavior of electrons and electron-currents is increasingly governed by quantum mechanics, and uncertainties in electron position and momentum translate into difficulties in designing and fabricating tiny electronic components that operate in compliance with desired models and behaviors developed for larger-scale components. For this reason, new nanoscale technologies, including nanowire-crossbar arrays, have been developed in order to push densities of memory-storage elements to much greater levels than can be achieved by current photolithography-based fabrication techniques. Nanowire crossbars can be fabricated using nanoscale imprint lithography, molecular self-assembly, and other techniques that are not constrained by diffraction limits of electromagnetic radiation, which constrain photolithography. Designers, manufacturers, and, ultimately, users of electronic devices and systems based on integrated circuits and integrated-circuit memories continue to seek further improvements in processor speeds and memory densities using these newer technologies, including nanowire-crossbar arrays, combined with traditional photolithography-based integrated circuits.

DETAILED DESCRIPTION OF THE INVENTION

Embodiments of the present invention are directed to three-dimensional integrated circuits comprising one or more layers of circuitry fabricated by traditional photolithography methods, such as microscale and/or submicroscale CMOS circuitry, above which multiple layers of nanowire-crossbar arrays are layered to form multiple layers of electronic memory within the three-dimensional integrated circuit. Microscale components have at least one dimension of less than a fixed number of micrometers, such as 500 µm or 100 µm or 10 µm. Submicroscale components have at least one dimension of less than 1 micrometer. Nanoscale components have at least one dimension of less than a fixed number of nanometers, such as 50 nm or 10 nm. Such three-dimensional integrated circuits that combine both traditional, photolithography-fabricated circuitry and newer nanowire-crossbar array take advantage of the precision and logical complexity provided by CMOS circuitry, and other traditional photolithography-fabricated circuitry, with the much higher data-storage densities provided by nanowire-crossbar arrays.

Figure 1:
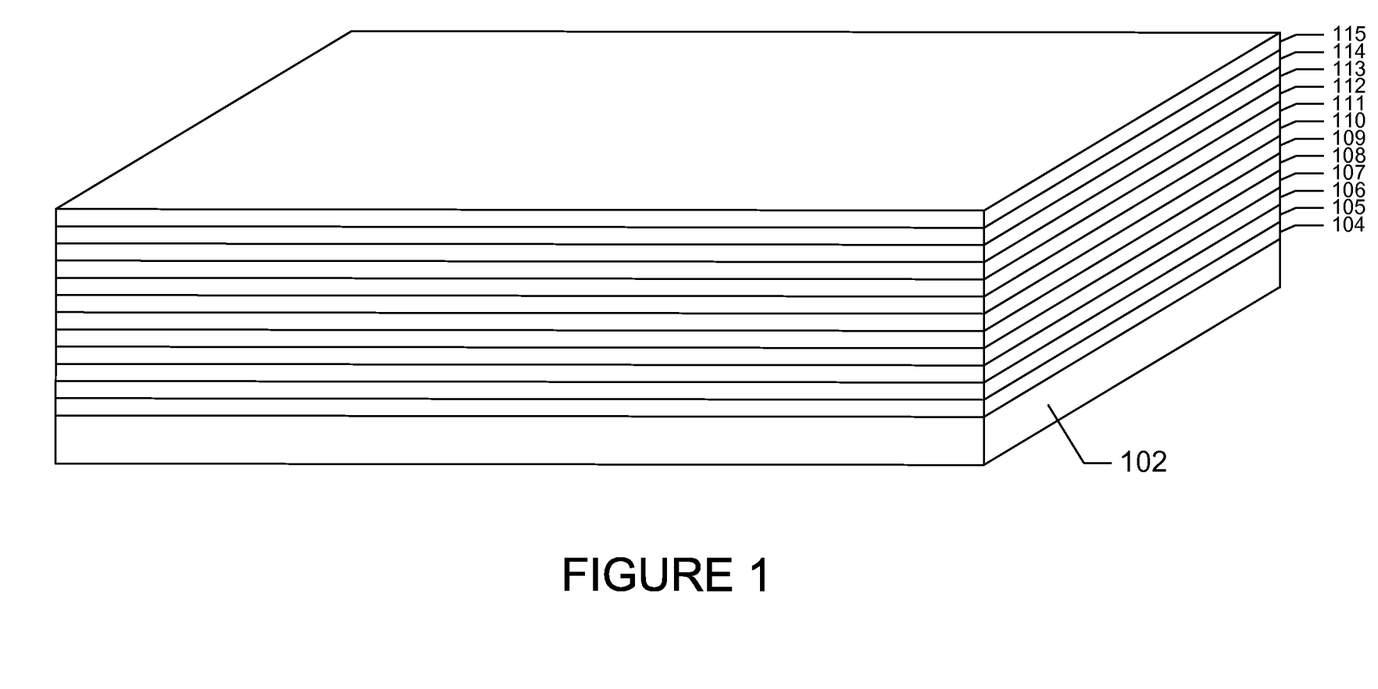
FIG. 1 illustrates a three-dimensional integrated circuit that represents one embodiment of the present invention.

FIG. 1 illustrates a three-dimensional integrated circuit that represents one embodiment of the present invention. As shown in FIG. 1, the three-dimensional integrated circuit includes a CMOS-layer substrate 102 and 12 nanowire-crossbar layers 104-115. The CMOS substrate 102 includes traditional logic circuits, macroscale input and output pins, and other familiar components of integrated circuits, while the nanoscale-crossbar layers 104-115 each comprises a two-dimensional array of memory elements, each of which can store one bit of information. The three-dimensional integrated circuit shown in FIG. 1 may be a dense memory chip or may be a processor or specialized integrated circuit with a large amount of on-board electronic memory implemented by the multiple layers of nanowire-crossbar memories.

Figure 2:
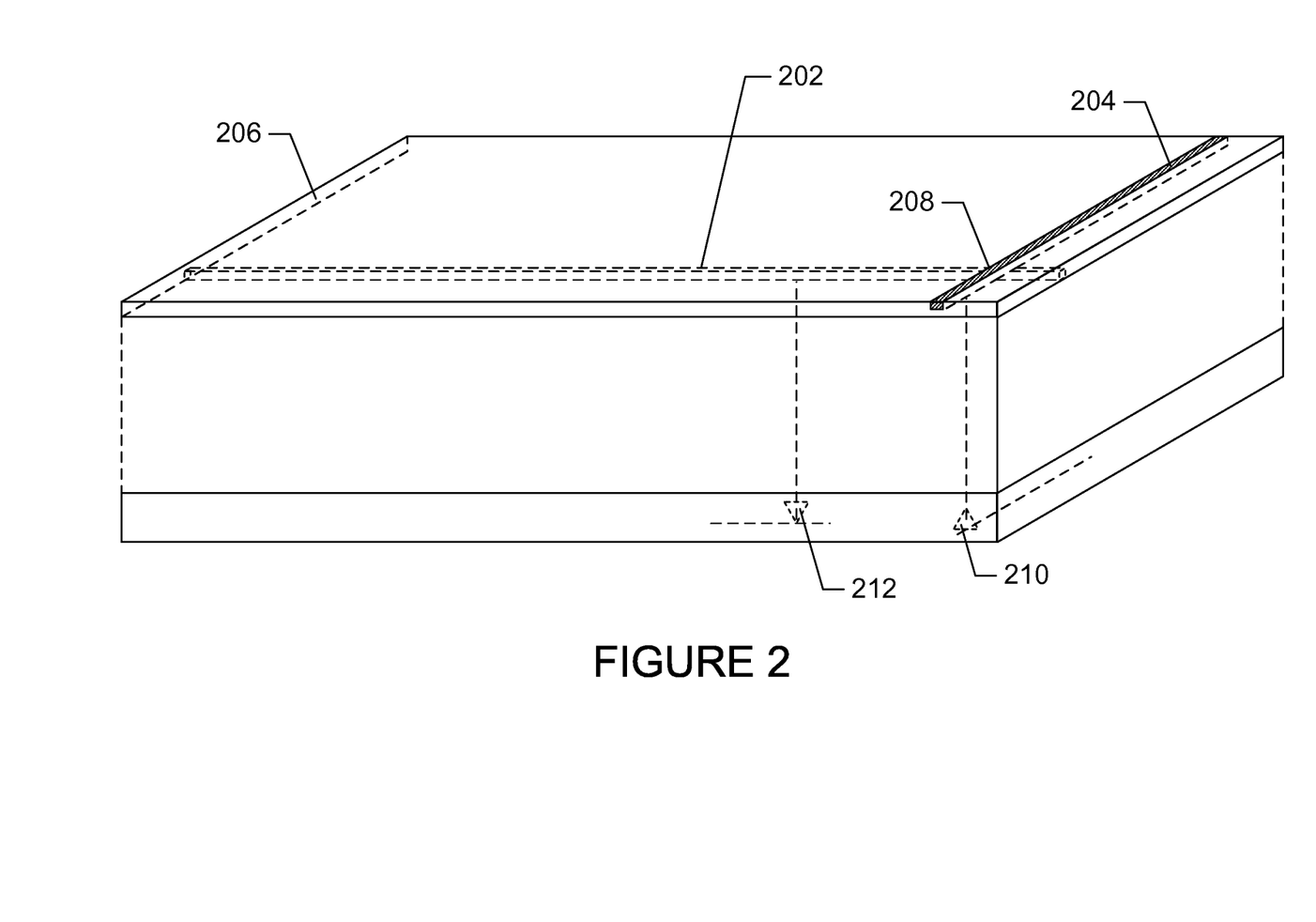
FIG. 2 illustrates the fundamental memory-storage components of the three-dimensional integrated circuit, shown in FIG. 1, that represents one embodiment of the present invention.

FIG. 2 illustrates the fundamental memory-storage components of the three-dimensional integrated circuit, shown in FIG. 1, that represents one embodiment of the present invention. In FIG. 2, two approximately orthogonal nanowires 202 and 204 within the top-most nanowire-crossbar level 206 intersect to form a nanowire-crossbar junction 208 which serves as a one-bit storage element. Nanowire 204 is interconnected with a CMOS driver circuit 210 and nanowire 202 is interconnected with a CMOS sensor circuit 212. Under CMOS-layer logic control, various different voltages may be applied to the nanowire junction by concerted operation of the driver 210 and sensor 212, and the current flowing through the nanowire junction can be measured, by sensor 212, to determine the data state, or data contents, of the nanowire junction.

Figure 3:
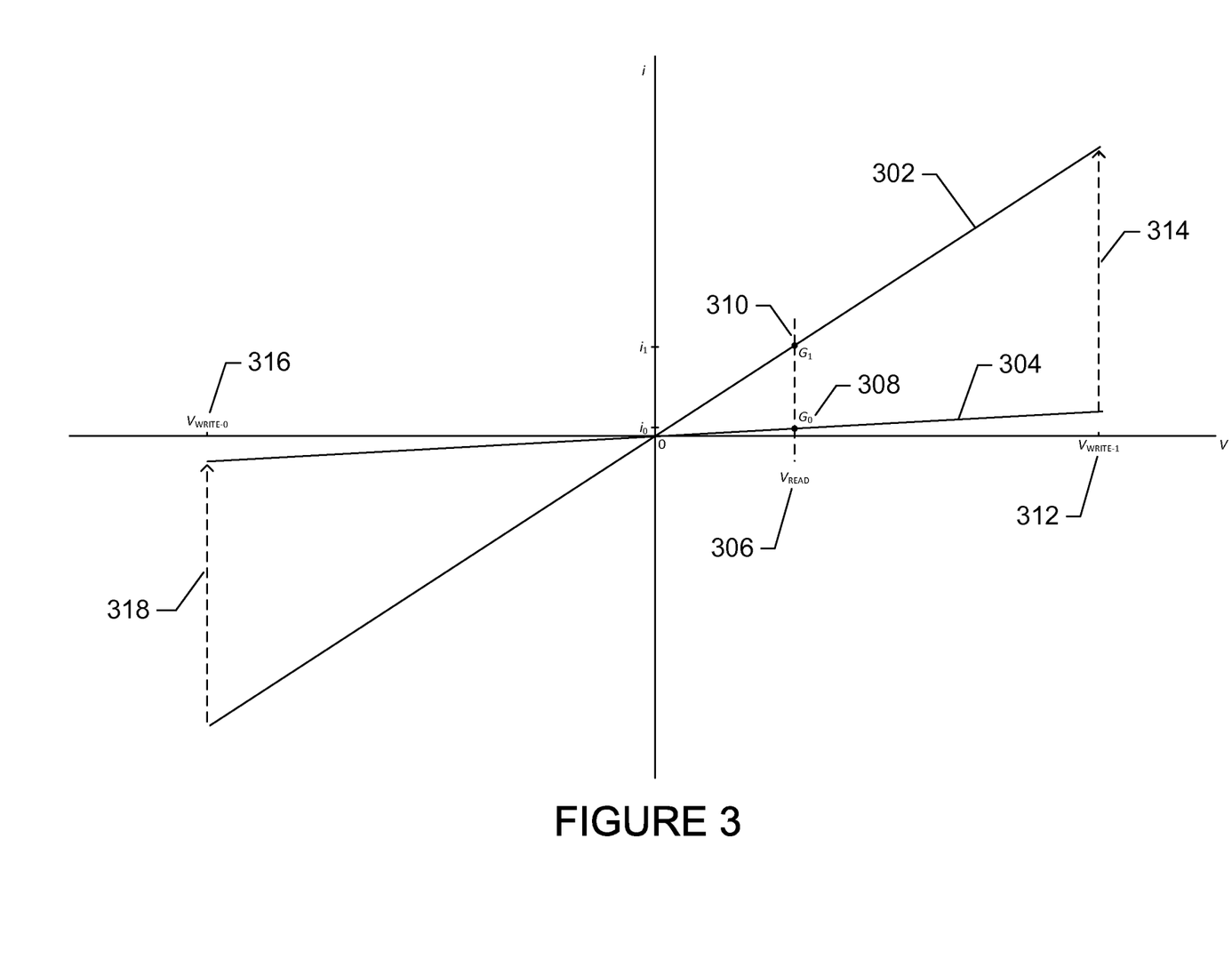
FIG. 3 illustrates one type of nanowire-junction memory.

FIG. 3 illustrates one type of nanowire-junction memory. FIG. 3 shows the current-versus-voltage curves for two different physical states of a memristor. Curve 302, which appears linear in the relatively low-voltage portion of the current/voltage plane shown in FIG. 3, corresponds to a relatively high-conductance physical state which can be arbitrarily designated to correspond to the binary value "1." Curve 304 represents a second, relatively low-conductance physical state for the memristor. When a relatively low-magnitude voltage, $V_{READ}$ 306, is applied to the memristor, and the current passing through the memristor at this applied voltage is measured, the two physical states can be distinguished from one another by the conductance computed from the measured current, $G_0$ 308 for the relatively low-conductance state and $G_1$ 310 for the relatively high-conductance state. The memristor can be forced from the relatively low-conductance state, corresponding to curve 304, to the relatively high-conductance state, corresponding to curve 302, by application of a positive WRITE voltage, $V_{WRITE-1}$ 312, as indicated by dashed arrow 314 in FIG. 3. Similarly, the memristor can be forced from the relatively high-conductance state, represented by curve 302, to the relatively low-conductance state, represented by curve 304, by application of a negative voltage, $V_{WRITE-0}$ 316, as indicated by dashed arrow 318 in FIG. 3. Thus, a memristor is a bistable device that can persistently store a single bit of information. The memristor can be placed into either of two binary data states, "1," and "0," by application of the two voltages $V_{WRITE-1}$ and $V_{WRITE-0}$, respectively, and the data state of the memristor can be determined by measuring the current that passes through the memristor when a voltage $V_{READ}$ is applied across the memristor. Returning to FIG. 2, the memory element 208 of the junction between nanowires 202 and 204 may be a memristive memory element with the electronic characteristics characterized in FIG. 3. Thus, logic control of the driver circuit 210 and sensor circuit 212 can store a particular binary value into the nanowire junction memory element by applying the voltages $V_{WRITE-1}$ and $V_{WRITE-0}$, and application of the voltage $V_{READ}$ and measuring the current passing through the nanowire junction by sensor 212 can determine the current data state of the memristive nanowire junction.

Figure 4:
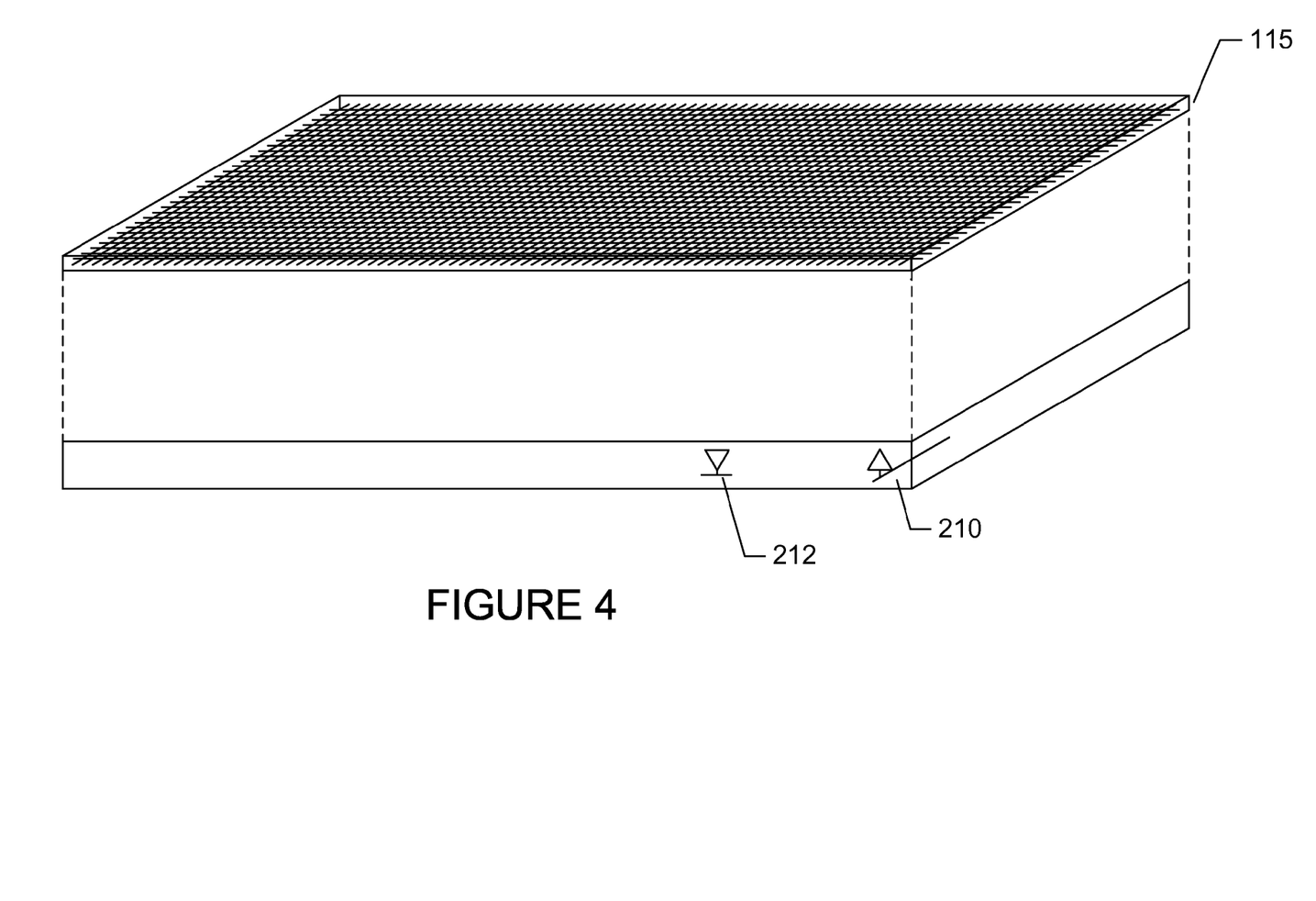
FIG. 4 illustrates the relative differences in scale and density of the CMOS layer and nanowire-crossbar layers of a three-dimensional integrated circuit that represents one embodiment of the present invention.

While FIG. 2 illustrates a single nanowire junction, and while it may appear straightforward to interconnect nanowires with underlying CMOS circuitry in order to read and write individual nanowire junctions from FIG. 2, it is, in fact, difficult to devise a three-dimensional integrated circuit to provide addressability of all of the memory elements in a multi-layer integrated circuit, such as that shown in FIG. 1. FIG. 4 illustrates the relative differences in scale and density of the CMOS layer and nanowire-crossbar layers of a three-dimensional integrated circuit that represents one embodiment of the present invention. In FIG. 4, a small portion of the top-most nanowire-crossbar level 115 of the three-dimensional integrated circuit is shown to include a dense two-sublayer array formed by two sets of parallel nanowires, the nanowires in the two sets oriented approximately orthogonal to one another. FIG. 4 is intended to show the contrast between the high density, and extremely small feature size, of the memory elements within the portion nanowire-crossbar array as opposed to the feature size and density of the corresponding portion of the CMOS layer, represented by the single driver 210 and sensor 212 discussed above, with reference to FIG. 2, needed to address a single nanowire-junction memory element. While the problem of addressing a single nanowire-crossbar array, such as layer 115 in FIG. 4, can be addressed by careful design and construction of CMOS demultiplexer circuitry and other components, addressing multiple, densely fabricated nanowire-crossbar levels from a single CMOS substrate presents a significant engineering challenge.

Figure 5:
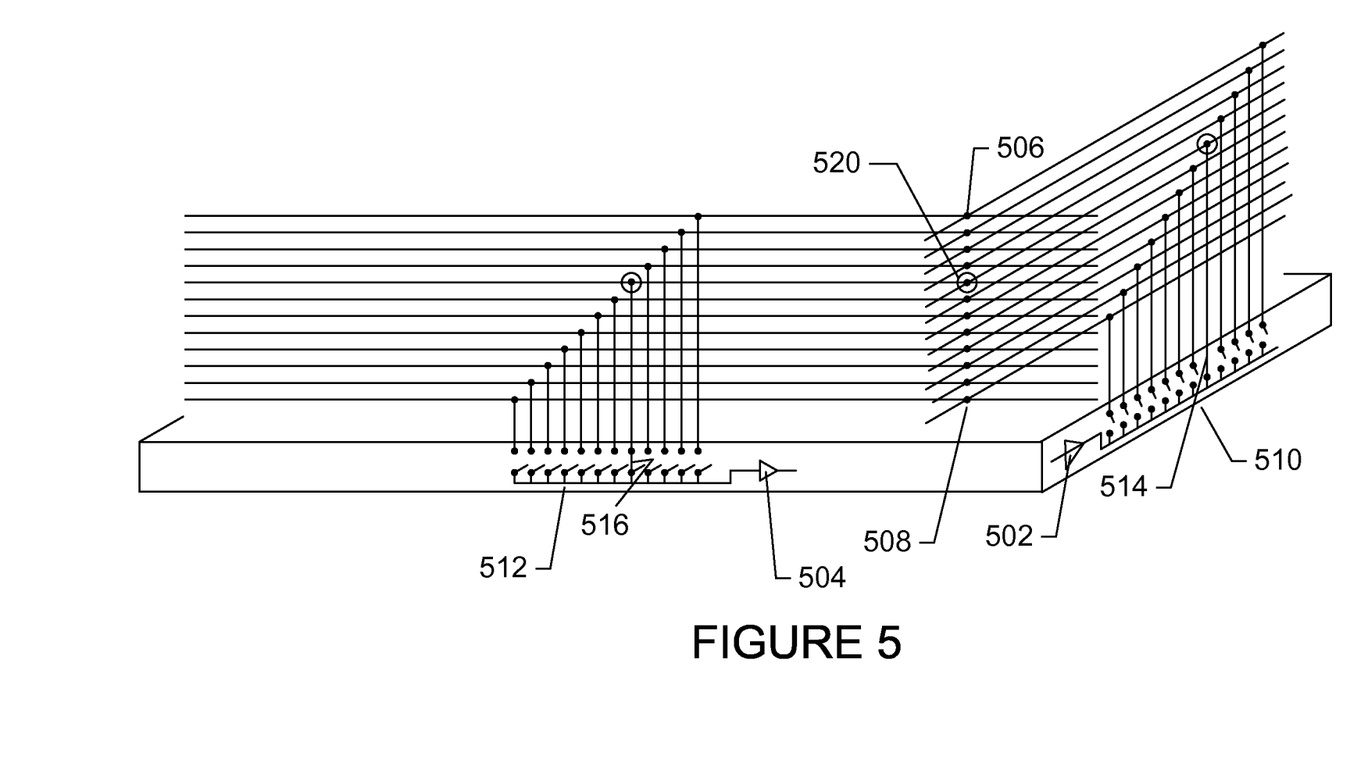
FIGS. 5 and 6 illustrate an approach, provided by one embodiment of the present invention, for addressing multiple nanowire-crossbar layers above a CMOS layer using differential partitioning of the layers.
Figure 6:
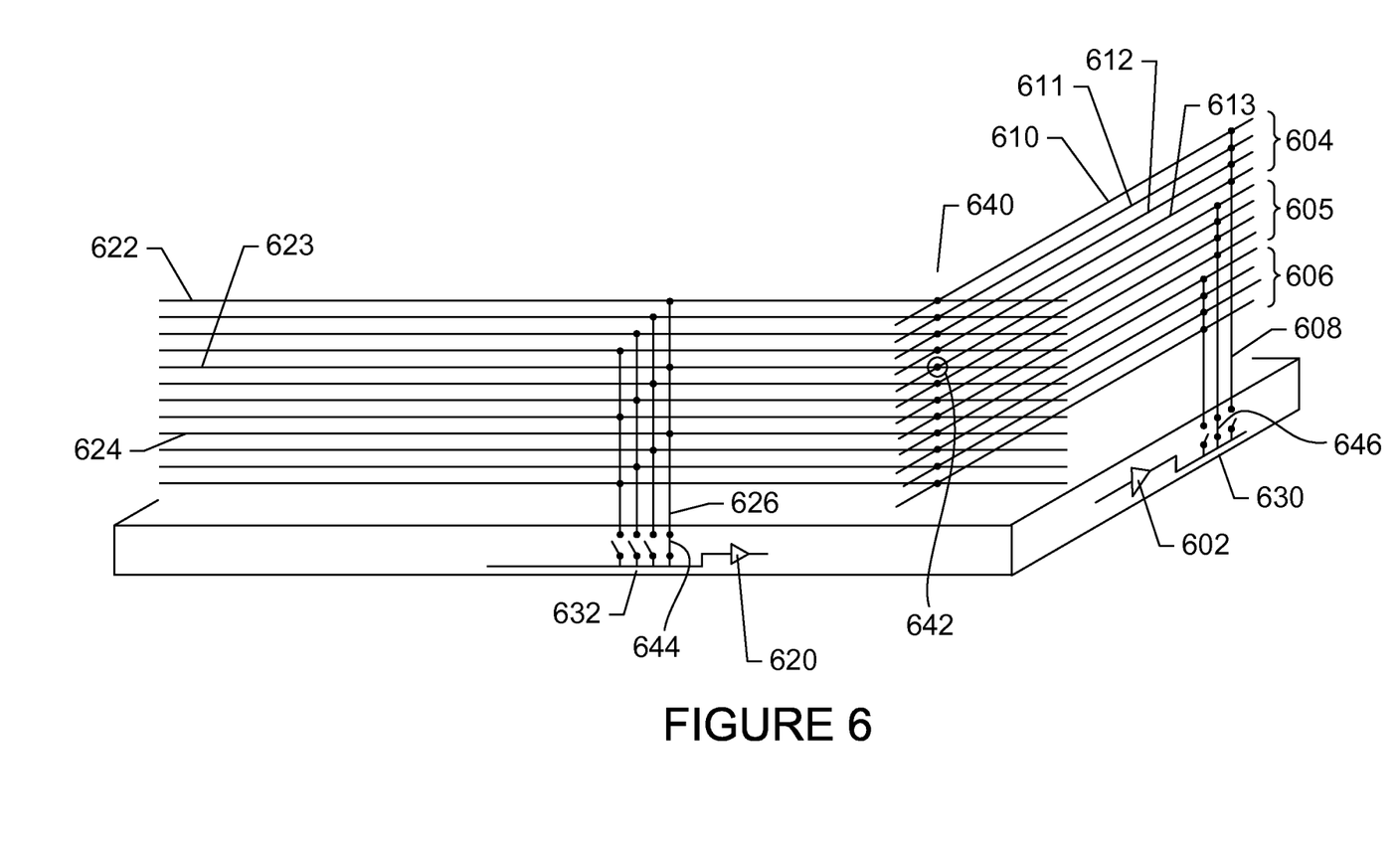

FIGS. 5 and 6 illustrate an approach, provided by one embodiment of the present invention, for addressing multiple nanowire-crossbar layers above a CMOS layer using differential partitioning of the layers. In FIG. 2, above, a separate CMOS driver and sensor (210 and 212 in FIG. 2) are shown as being employed to address a single nanowire junction 208. Clearly, because of the disparities in feature densities between the nanowire-crossbar layers and the CMOS layer, devoting a CMOS circuit to each nanowire-crossbar memory element would not be feasible. The area of the CMOS layer would need to exceed the area of the nanowire-crossbar layers above the CMOS layer by several orders of magnitude. Instead, in three-dimensional integrated circuits that represent embodiments of the present invention, CMOS features, such as drivers and sensors, need to be interconnected with, and operate on, multiple memory elements and multiple nanowire-crossbar levels.

A first approach is shown in FIG. 5. As shown in FIG. 5, a single driver 502 and a single sensor 504 in the CMOS layer are interconnected with a nanowire in each nanowire-crossbar level. The single driver 502 and sensor 204 can be used to access, individually, each nanowire junction, such as nanowire junction 506, in a vertical column of nanowire junctions 508 that spans the multiple nanowire-crossbar layers. As shown in FIG. 5, both a driver 502 and sensor 504 are connected to the multiple nanowires through a bank of switches 510 and 512, respectively. Closing one switch 514 in the bank of switches 510 interconnected with the driver 502 and closing a single, corresponding switch 516 in the bank of switches 512 interconnected with the sensor 504 selects one particular nanowire junction 520 from among the nanowire junctions in the column of nanowire junctions 508 that span the nanowire-crossbar levels. While this first approach effectively extends control of a single driver 502 and sensor 504 over an entire column of nanowire junctions 508, the technique does so at the expense of fabrication of two banks of switches that each includes a switch for each nanowire junction in the column of nanowire junctions 508.

FIG. 6 illustrates a second method for addressing nanowire junctions according to one embodiment of the present invention. As shown in FIG. 6, the 12 nanowire-crossbar layers are partitioned, for access by a driver 602, into three partitions 604-606. The driver 602 is interconnected with nanowires in each nanowire-crossbar-level partition by a single signal line, or via, such as via 608 that interconnects the driver 602 with four nanowires 610-613 in the top-most partition 604 of nanowire-crossbar levels. A sensor 620 is connected with nanowires in the four different partitions of the nanowire-crossbar levels by four signal lines. For example, nanowires 622-624 reside in nanowire-crossbar levels that form a first partition interconnected with sensor 620 by signal line 626. When one switch in the bank of switches 630 interconnected with a driver 602 is closed, four nanowires are interconnected with the driver. When a single switch in the bank of switches 632 interconnected with the sensor 620 is closed, the sensor is interconnected with three different nanowires. The partitioning of nanowire-crossbar layers with respect to the driver 602 and sensor 620 is different for the driver and sensor and is carried out so that, when a single switch is closed in the bank of switches 630, each of the four nanowires interconnected to the driver by closing of a switch can be separately accessed by closing one of the four switches in the bank of switches 632 interconnected with a sensor 620. Thus, by differentially partitioning the nanowire-crossbar levels with respect to the switches associated with the two CMOS features 602 and 620, an entire column of nanowire junction memory elements 640 that spans the multiple nanowire-crossbar levels can be individually accessed. As one example, the memory element 642 is connected to the sensor 620 and driver 602 by switches 644 and 646. In the method illustrated in FIG. 6, which represents one embodiment of the present invention, only seven switches are employed, rather than the 24 switches needed in the method shown in FIG. 5. Using the differential-partitioning-of-nanowire-crossbar-levels method, shown in FIG. 6, the product of the number of switches associated with each of two CMOS features is equal to the number of individual nanoscale features that can be accessed within the multiple nanowire-crossbar levels.

Figure 7:
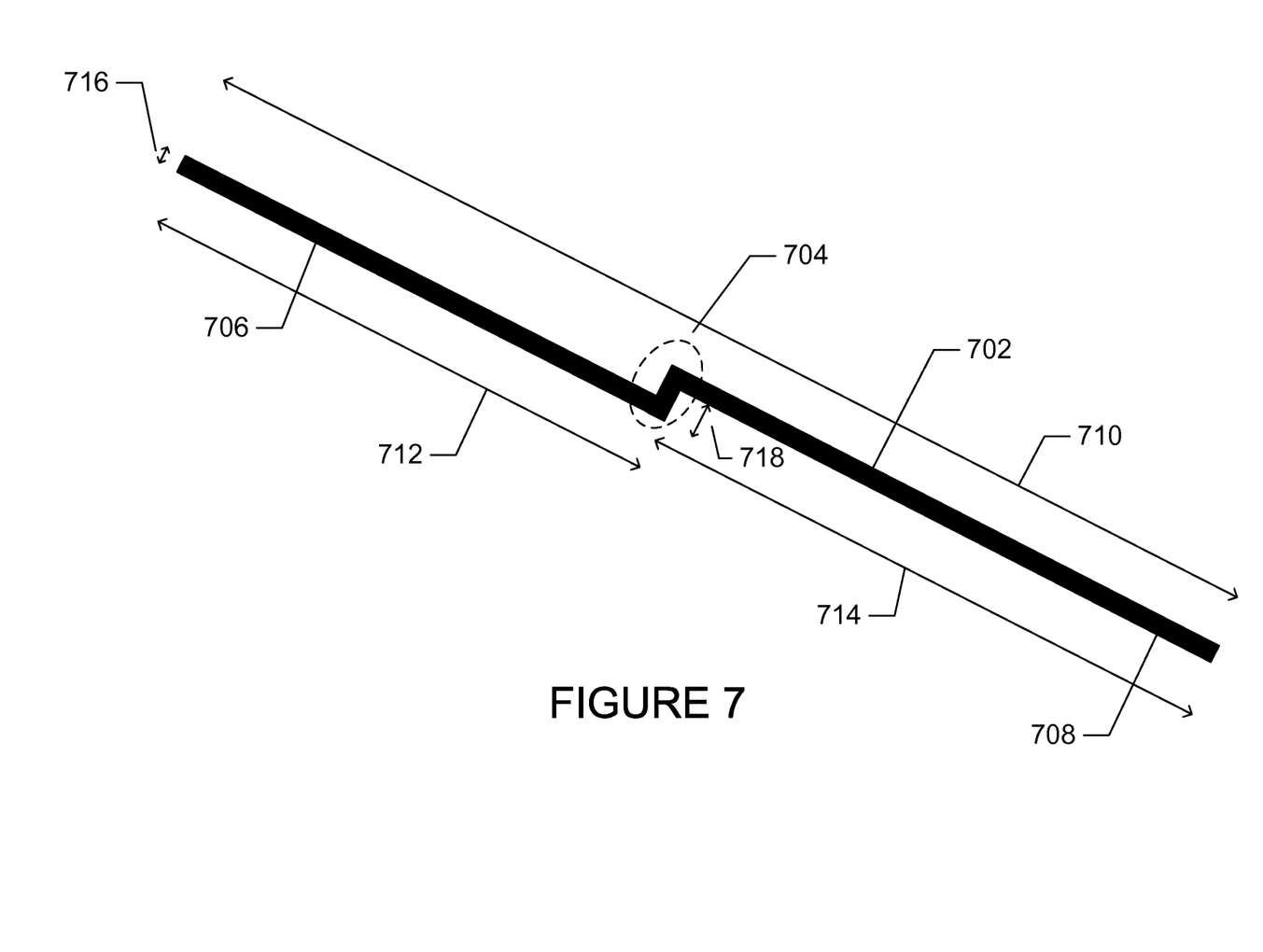
FIGS. 7-10 illustrate construction of each nanowire-crossbar level of a three-dimensional integrated circuit according to certain embodiments of the present invention.

FIGS. 7-10 illustrate construction of each nanowire-crossbar level of a three-dimensional integrated circuit according to certain embodiments of the present invention. As shown in FIG. 7, an individual nanowire 702 within a nanowire-crossbar array includes a step-like or square-S-shaped discontinuity 704 joining two linear arms 706 and 708. The nanowire can be parameterized by an overall length 710, the length of each arm 712 and 714, the width of the nanowire 716, and the offset 718 from equivalent edges of the two arms generated by the discontinuity 704.

Figure 8:
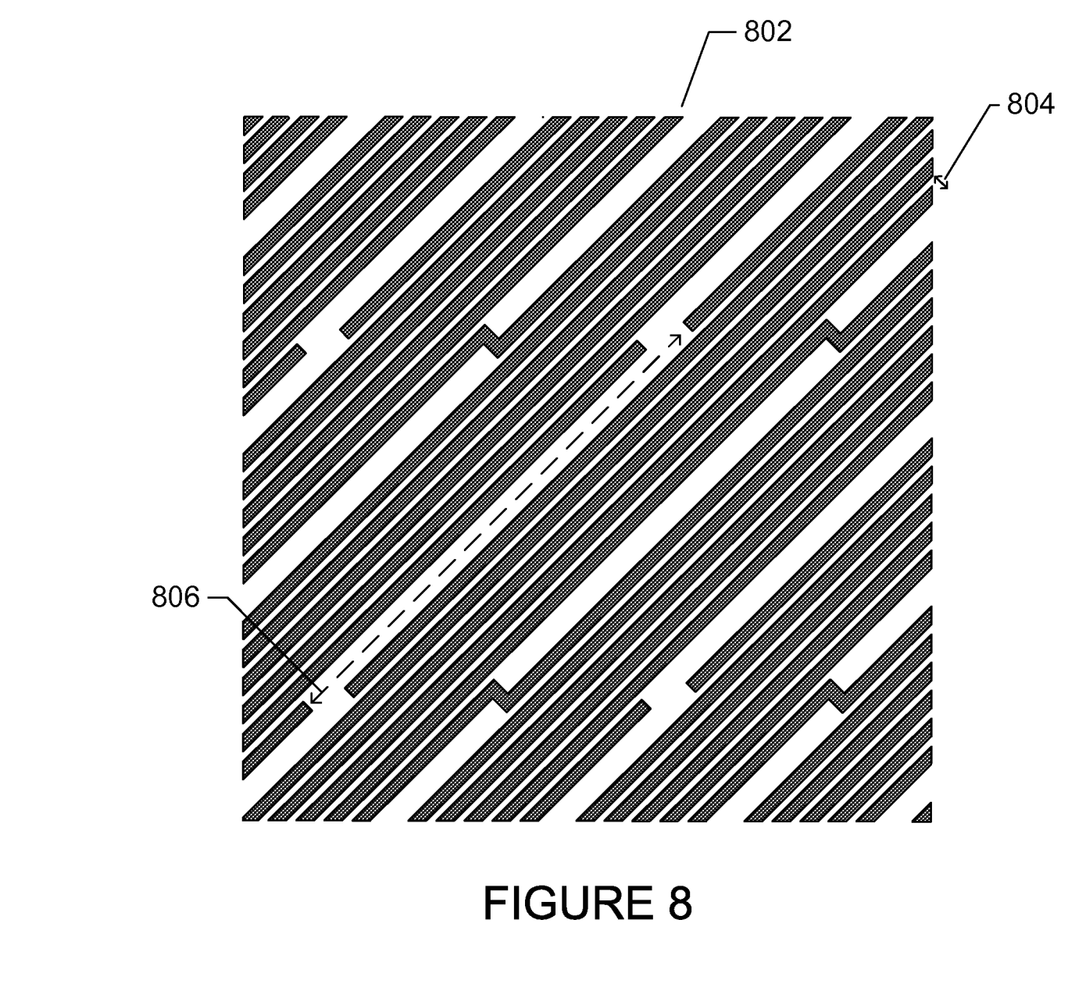

FIG. 8 illustrates arrangement of a large number of nanowires, such as the nanowire shown in FIG. 7, into a single nanowire layer. The nanowires are arranged parallel to one another in the layer 802. Construction of the layer is parameterized by the vertical distance between adjacent, parallel nanowires 804 as well as by the length of a gap 806 between the end of one nanowire and the beginning of another, collinear nanowire in the layer.

Figure 9:
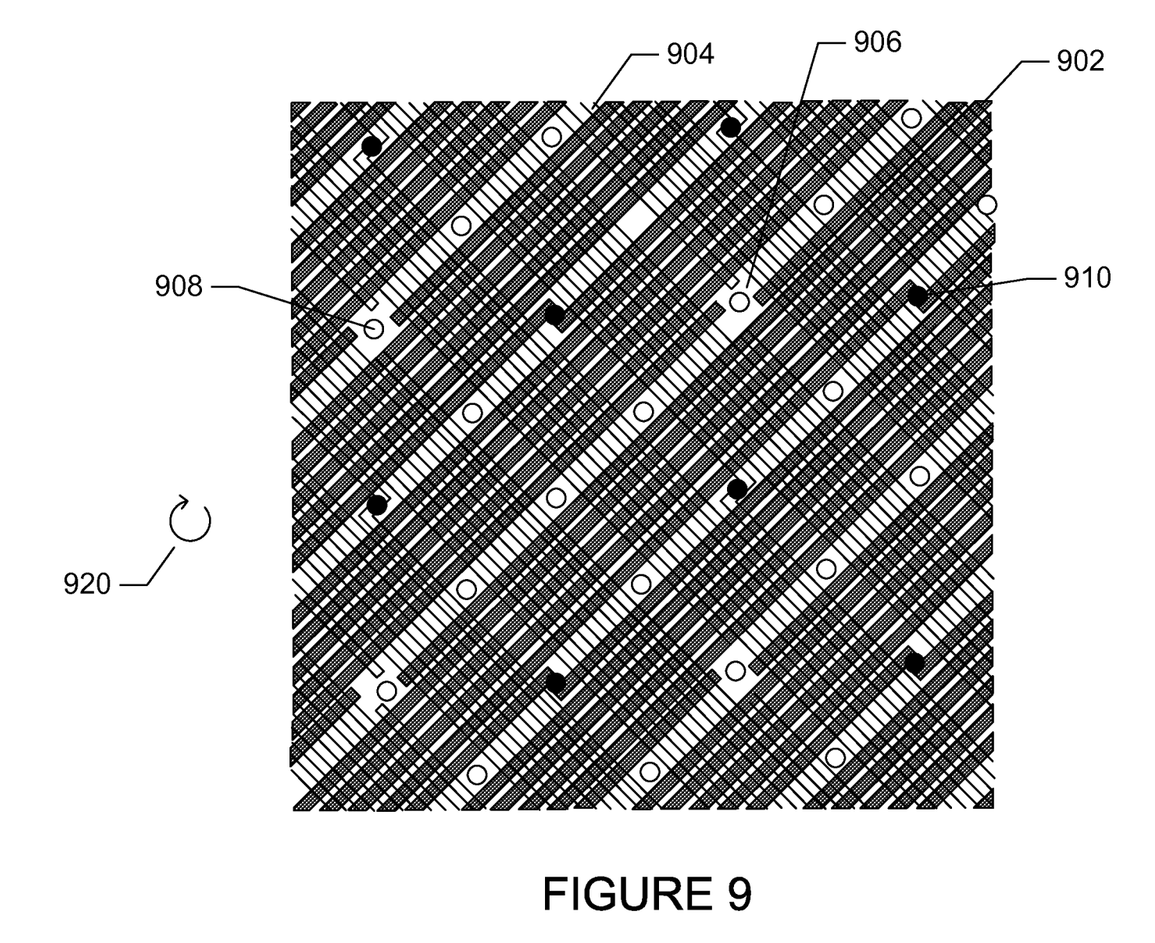

FIG. 9 illustrates overlaying of two nanowire layers, such as the nanowire layer shown in FIG. 8, to form a two-sublayer nanowire crossbar. In FIG. 9, the nanowires of the top layer are shown shaded, such as nanowire 902, and the nanowires of the lower sublayer are shown unshaded, such as nanowire 904. The discontinuities in individual nanowires form channels in each nanowire sublayer, and intersection of those channels form empty spaces, such as empty space 906. Within these empty spaces, vias, or signal lines perpendicular to the plane of the figure, can pass through the nanowire crossbar layer without electrical contact to any of the nanowire vias within the nanowire-crossbar layer. In FIG. 9, such vias are shown as open circles, such as open circle 908 representing a vertical via. The two sublayers are oriented with respect to one another so that the discontinuity of a nanowire in one layer is overlapped by an open channel in the other layer, so that a via can interconnect at the discontinuity with a nanowire to interconnect the nanowire with CMOS circuitry in the CMOS substrate below the nanowire-crossbar layer. In FIG. 9, such vias interconnecting with discontinuities of nanowires are shown as filled circles, such as filled circle 910. As shown in FIG. 9, a two-sublayer nanowire-crossbar array can be characterized by the relative angle 920 of one sublayer to the other as well as the translational displacement between a reference point on one sublayer and an equivalent reference point on another layer. In general, the relative angle is near or equal to 90 degrees, and the sublayers are translationally oriented, as shown in FIG. 9, so that channels formed by nanowire discontinuities in one level overlap with the nanowire discontinuities in the other level and so that open areas, such as open area 906, are formed to allow vias to pass through the nanowire-crossbar without electronically contacting any of the nanowires within the nanowire crossbar.

Figure 10:
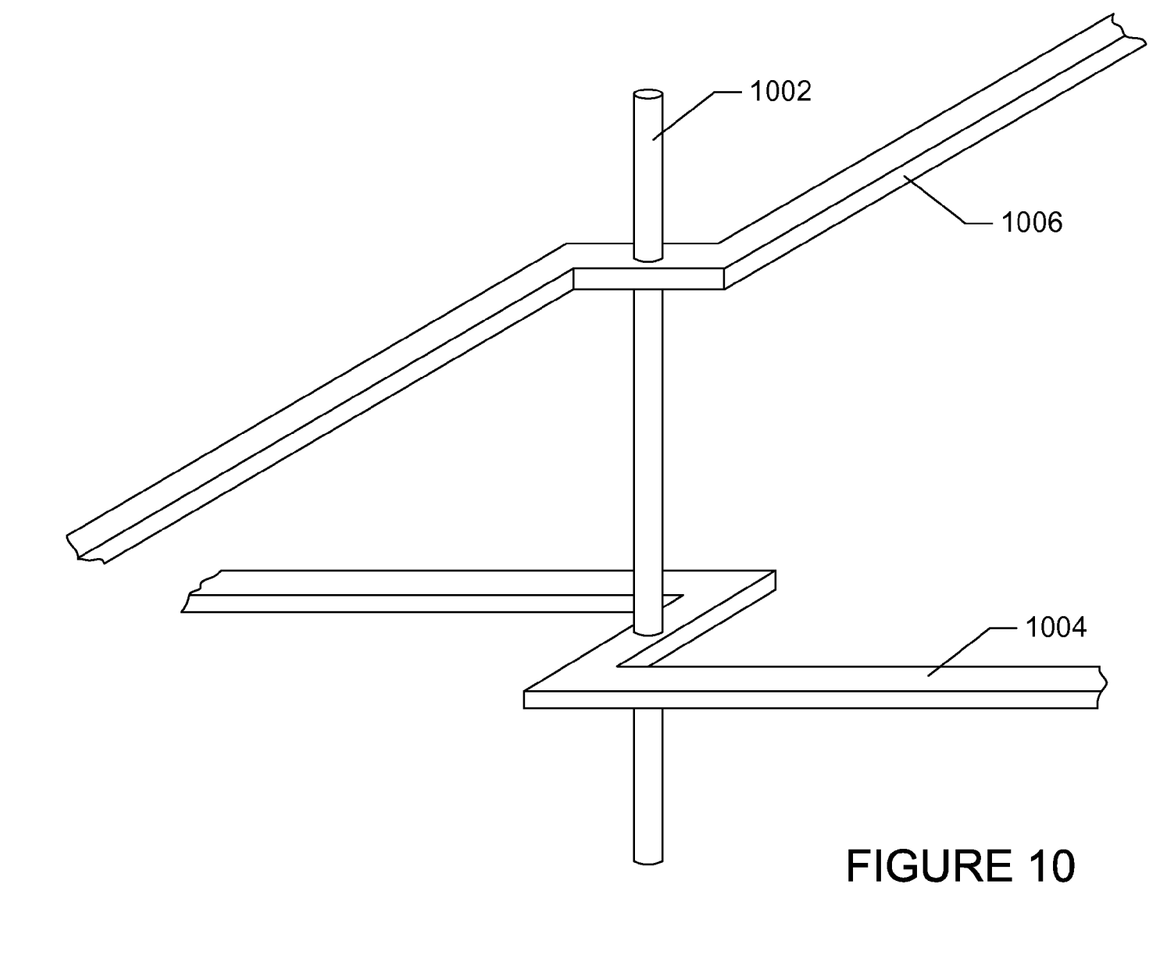

FIG. 10 illustrates a via within a three-dimensional integrated circuit that represents one embodiment of the present invention. The via 1002 interconnects with two different nanowires 1004 and 1006 of two different nanowire-crossbar levels. Vias can be interconnected with an arbitrary number of nanowires and an arbitrary number of nanowire-crossbar layers, depending on the structure of the nanowire-crossbar layers, as illustrated in FIGS. 7-9, and the orientations of those layers. By varying the various parameters discussed above with reference to FIGS. 6 and 9, and by varying the number of nanowires interconnected with each via and the positions and interconnections of the vias with respect to the CMOS substrate, the nanowire-crossbar memory-element addressing scheme discussed with reference to FIG. 6 can be implemented to provide efficient addressing of each nanowire junction memory element within multiple nanowire-crossbar levels stacked above one or more traditional-integrated-circuit layers.

Although the present invention has been described in terms of particular embodiments, it is not intended that the invention be limited to these embodiments. Modifications will be apparent to those skilled in the art. For example, any of the above-mentioned parameters, including the dimensions of individual nanowires, the organization of the individual nanowires within a nanowire sublayer, and the orientation of two nanowire sublayers within a nanowire-crossbar level can be varied to produce nanowire-crossbar levels that provide a desired level of interconnectability with the underlying CMOS substrate and, at the same time, providing sufficient number of open spaces for interconnection of other nanowire-crossbar levels to the CMOS substrate independently of a given nanowire-crossbar level. Any of a variety of different technologies can be used to implement the one or more underlying integrated-circuit substrates, including the CMOS technology, with any of a wide variety of different logic-circuit contents, functionalities, and geometries. Nanowire-crossbar layers can be fabricated by nanoscale imprint lithography, assembly, and other methods, the nanowires and the nanowire junctions may comprise any of various different metal, metal-oxide, and organic-polymer substances.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated.

It is intended that the scope of the invention be defined by the following claims and their equivalents:

1. A three-dimensional integrated circuit comprising:
   a submicroscale integrated-circuit substrate; and
   n nanoscale layers stacked above the submicroscale integrated-circuit substrate, a nanowire-junction memory element in each of which is independently controlled by two submicroscale subcomponents within the submicroscale integrated-circuit substrate, the first submicroscale subcomponent coupled through a first set of switches to each of the n nanowire-junction memory elements and the second submicroscale subcomponent coupled through a second set of switches to each of the n nanowire-junction memory elements, the total number of switches in the first and second sets of switches less than 2n, and n greater than or equal to 2.

2. The three-dimensional integrated circuit of claim 1 wherein the n memory elements are memristive nanowire junctions.

3. The three-dimensional integrated circuit of claim 2 wherein the first submicroscale subcomponent is a driver and the second submicroscale subcomponent is a sensor.

4. The three-dimensional integrated circuit of claim 3 wherein, to set the data state of a memory element to a first data state, logic within the integrated-circuit substrate submicroscale subcomponent:
   closes a first switch to connect the driver to the memory element;
   closes a second switch to connect the sensor to the memory element; and
   applies a first WRITE voltage across the memory element.

5. The three-dimensional integrated circuit of claim 3 wherein, to set the data state of a memory element to a second data state, logic within the integrated-circuit substrate submicroscale subcomponent:
   closes a first switch to connect the driver to the memory element;
   closes a second switch to connect the sensor to the memory element; and
   applies a second WRITE voltage of opposite polarity from the first WRITE voltage across the memory element.

6. The three-dimensional integrated circuit of claim 3 wherein, to read the data state of a memory element, logic within the integrated-circuit substrate submicroscale subcomponent:
   closes a first switch to connect the driver to the memory element;
   closes a second switch to connect the sensor to the memory element;
   applies a READ voltage across the memory element; and
   determines a current that flows through the memory element while the READ voltage is applied.

7. The three-dimensional integrated circuit of claim 3 wherein the n nanoscale layers are partitioned in two different ways, the memory element in each nanoscale layer of each partition of the first partitioning interconnected to the sensor by a single via and switch, and the memory element in each nanoscale layer of each nanoscale partition of the second partitioning interconnected to the driver by a single via and switch.

8. A method for interconnecting a submicroscale integrated-circuit substrate of a three-dimensional integrated circuit to n nanoscale layers stacked above the submicroscale integrated-circuit substrate, the method comprising:
   selecting a memory element in each of the n nanoscale layers to select n memory elements; and
   coupling two submicroscale subcomponents within the submicroscale integrated-circuit substrate to each memory element, the first submicroscale subcomponent interconnected through a first set of switches to the n nanowire-junction memory elements and the second submicroscale subcomponent interconnected through a second set of switches to the n nanowire-junction memory elements, the total number of switches in the first and second sets of switches less than 2n, and n greater than or equal to 2.

9. The method of claim 8 wherein the memory elements are memristive nanowire junctions.

10. The method of claim 9 wherein the first submicroscale subcomponent is a driver and the second submicroscale subcomponent is a sensor.

11. The method of claim 9 further including setting the data state of a memory element to a first data state by:
   closing a first switch to connect the driver to the memory element;
   closing a second switch to connect the sensor to the memory element; and
   applying a first WRITE voltage across the memory element.

12. The method of claim 9 further including setting the data state of the memory element to a second data state by:
   closing a first switch to connect the driver to the memory element;
   closing a second switch to connect the sensor to the memory element; and
   closing a second WRITE voltage of opposite polarity from the first WRITE voltage across the memory element.

13. The method of claim 9 further including reading the data state of the memory element by:
   closing a first switch to connect the driver to the memory element;
   closing a second switch to connect the sensor to the memory element;
   closing a READ voltage across the memory element; and
   determining a current that flows through the memory element while the READ voltage is applied.

14. The method of claim 9 further including:
   partitioning the n nanoscale layers in two different ways;
   interconnecting the memory element in each nanoscale layer of each partition of the first partitioning to the sensor by a single via and switch; and
   interconnecting the memory element in each nanoscale layer of each nanoscale partition of the second partitioning to the driver by a single via and switch.

* * * * *